United States Patent
Kearns et al.

(10) Patent No.: US 12,241,173 B2
(45) Date of Patent: Mar. 4, 2025

(54) WAFER SHIELDING FOR PREVENTION OF LIPSEAL PLATE-OUT

(71) Applicant: Lam Research Corporation, Fremont, CA (US)

(72) Inventors: Gregory J. Kearns, West Linn, OR (US); Lee Peng Chua, Beaverton, OR (US); Jacob Kurtis Blickensderfer, Portland, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 428 days.

(21) Appl. No.: 17/754,345

(22) PCT Filed: Sep. 30, 2020

(86) PCT No.: PCT/US2020/053518
§ 371 (c)(1),
(2) Date: Mar. 30, 2022

(87) PCT Pub. No.: WO2021/067419
PCT Pub. Date: Apr. 8, 2021

(65) Prior Publication Data
US 2022/0396894 A1    Dec. 15, 2022

Related U.S. Application Data

(60) Provisional application No. 62/911,029, filed on Oct. 4, 2019.

(51) Int. Cl.
C25D 17/00 (2006.01)
C25D 3/38 (2006.01)
(Continued)

(52) U.S. Cl.
CPC .......... *C25D 17/004* (2013.01); *C25D 3/38* (2013.01); *C25D 3/60* (2013.01); *C25D 5/022* (2013.01);
(Continued)

(58) Field of Classification Search
None
See application file for complete search history.

(56) References Cited

U.S. PATENT DOCUMENTS 9,752,248 B2 * 9/2017 Kagajwala ........... C25D 17/002
2004/0166789 A1   8/2004 Ashjaee et al.
(Continued)

FOREIGN PATENT DOCUMENTS

CN    102459717 A    5/2012
CN    102953104 A    3/2013
(Continued)

OTHER PUBLICATIONS

International Preliminary Report on Patentability dated Apr. 14, 2022 in PCT Application PCT/US2020/053518.
(Continued)

*Primary Examiner* — Louis J Rufo
(74) *Attorney, Agent, or Firm* — Weaver Austin Villeneuve & Sampson LLP

(57) ABSTRACT

Undesired deposition of metals on a lipseal (lipseal plate-out) during electrodeposition of metals on semiconductor substrates is minimized or eliminated by minimizing or eliminating ionic current directed at a lipseal. For example, electrodeposition can be conducted such as to avoid contact of a lipseal with a cathodically biased conductive material on the semiconductor substrate during the course of electroplating. This can be accomplished by shielding a small selected zone proximate the lipseal to suppress electrodeposition of metal proximate the lipseal, and to avoid contact
(Continued)

of metal with a lipseal. In some embodiments shielding is accomplished by sequentially using lipseals of different inner diameters during electroplating of metals into through-resist features, where a lipseal having a smaller diameter is used during a first electroplating step and serves as a shield blocking electrodeposition in a selected zone. In a second electroplating step, a lipseal of a larger inner diameter is used.

25 Claims, 10 Drawing Sheets

(51) Int. Cl.
| | |
|---|---|
| C25D 3/60 | (2006.01) |
| C25D 5/02 | (2006.01) |
| C25D 5/10 | (2006.01) |
| C25D 7/12 | (2006.01) |
| C25D 17/06 | (2006.01) |
| C25D 21/12 | (2006.01) |
| H01L 21/288 | (2006.01) |

(52) U.S. Cl.
CPC ............... *C25D 5/10* (2013.01); *C25D 7/12* (2013.01); *C25D 17/002* (2013.01); *C25D 17/008* (2013.01); *C25D 17/06* (2013.01); *C25D 21/12* (2013.01); *H01L 21/2885* (2013.01)

(56) References Cited

U.S. PATENT DOCUMENTS

| | | |
|---|---|---|
| 2007/0034526 A1 | 2/2007 | Makino et al. |
| 2009/0280649 A1 | 11/2009 | Mayer et al. |
| 2010/0155254 A1 | 6/2010 | Prabhakar et al. |
| 2011/0203518 A1 | 8/2011 | Katsuoka et al. |
| 2013/0042454 A1 | 2/2013 | Feng et al. |
| 2013/0062197 A1* | 3/2013 | He ..................... C25D 17/001 204/297.05 |
| 2013/0137242 A1 | 5/2013 | He et al. |
| 2016/0115615 A1 | 4/2016 | He et al. |
| 2016/0194780 A1* | 7/2016 | Nagai ................... C25D 17/06 204/242 |
| 2016/0201212 A1* | 7/2016 | Ostrowski ........... C25D 17/005 204/297.01 |
| 2017/0009369 A1 | 1/2017 | Berke et al. |
| 2017/0073832 A1 | 3/2017 | Berke et al. |
| 2017/0081775 A1 | 3/2017 | Kao et al. |
| 2019/0040544 A1 | 2/2019 | Berke et al. |
| 2023/0167571 A1 | 6/2023 | Oberst et al. |

FOREIGN PATENT DOCUMENTS

| | | |
|---|---|---|
| CN | 105624754 A | 6/2016 |
| CN | 106337199 A | 1/2017 |
| CN | 106480481 A | 3/2017 |
| CN | 107012495 A | 8/2017 |
| CN | 107254702 A | 10/2017 |
| CN | 107419312 A | 12/2017 |
| JP | 2019123935 A | 7/2019 |
| KR | 101581276 B1 | 1/2016 |
| TW | 201407003 A | 2/2014 |
| WO | WO-0075977 A1 | 12/2000 |

OTHER PUBLICATIONS

International Search Report and Written Opinion dated Jan. 15, 2021 in PCT Application PCT/US2020/053518.
International Search Report and Written Opinion dated Jul. 27, 2021, in PCT Application No. PCT/US2021/026248.
CN Office Action dated Jan. 5, 2024 in CN Application No. 202080070051.5 with English Translation.
International Preliminary Report on Patentability dated Nov. 10, 2022, in PCT Application No. PCT/US2021/026248.
SG Search Report and Written Opinion dated Aug. 23, 2024 in SG Application No. 11202203157Q.
U.S. Appl. No. 17/997,170, inventor Oberst et al., filed Oct. 26, 2022.
TW Office Action dated Nov. 12, 2024 in TW Application No. 110115031 with English translation.
U.S. Notice of Allowance dated Oct. 30, 2024 in U.S. Appl. No. 17/997,170.

* cited by examiner

WAFER SHIELDING FOR PREVENTION OF LIPSEAL PLATE-OUT

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD OF THE INVENTION

This invention pertains to methods and apparatuses for semiconductor device manufacturing. Specifically, embodiments of this invention pertain to electrodeposition of metals, particularly to through-mask electroplating.

BACKGROUND

Through-mask electroplating in semiconductor device fabrication involves electrodeposition of metals into recessed features (through-mask recessed features) that have an exposed conductive layer at the bottom portions of the recessed features. The sidewalls of the recessed features and the field region in these substrates are made of a non-conductive mask material, such as photoresist. During electroplating, the semiconductor substrate is cathodically biased by making an electrical contact to the conductive layer that underlies the mask material and by applying a negative voltage from a power supply to that layer. The contact is typically made at the periphery of the semiconductor substrate in the substrate holder assembly.

The substrate holder also typically includes a cup holding the semiconductor substrate and an elastomeric lipseal, which seals the outer edge and backside of the wafer substrate from an electrolyte. During electroplating, the cathodically biased substrate is brought into contact with an electrolyte, which causes electrochemical reduction of ions contained in the electrolyte upon contact with the cathodically biased metal on the semiconductor substrate. In some applications, such is in wafer level packaging (WLP) two metals such as tin and silver are electroplated using an electrolyte containing tin and silver ions. The formed tin-silver (SnAg) bumps can then be used for soldering several substrates together.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In one aspect, a method of electrodepositing a metal onto a semiconductor substrate having a plurality of through-mask recessed features, while preventing or reducing deposition of the metal on a lipseal of an electroplating apparatus (referred to as lipseal plate-out), is provided. In one embodiment the method includes: (a) electrodepositing a first metal into the through-mask recessed features of the semiconductor substrate in a first electroplating cell using a first lipseal; and (b) electrodepositing a second metal into the through-mask recessed features after electrodepositing the first metal, in a second electroplating cell using a second lipseal having a larger inner diameter than the first lipseal, where the semiconductor substrate includes a selected zone shielded from exposure to an electrolyte by the first lipseal but not by the second lipseal, such that the first metal is not electrodeposited in the selected zone and such that the second metal is allowed to be electrodeposited in the selected zone. The lipseals are typically made of an elastomeric material and seal the outer edge and the backside of the semiconductor substrates. The inner diameter of the lipseal refers to the diameter of an open portion of the lipseal. The width of the selected zone is typically equal to a difference between an inner radius of the second lipseal and an inner radius of the first lipseal.

In some embodiments electrodeposition of the second metal in the selected zone does not result in electrodeposition above a plane of the mask. Preferably, electrodeposition of the second metal in the selected zone does not result in contact of the electrodeposited second metal with the second lipseal. In some implementations electrodeposition of the second metal results in electrodeposition of the second metal above a plane of the mask outside of the selected zone. In one embodiments electrodeposition of the second metal results in electrodeposition of the second metal above a plane of the mask outside of the selected zone, and in electrodeposition below the plane of the mask in the selected zone.

In some embodiments the first and second metals are different metals. For example, in one embodiment the first metal is copper and the second metal is a combination of tin and silver. In other embodiments the first and second metals are the same metal (including a combination of metals). For example, in some embodiments the first metal is a combination of tin and silver, and the second metal is a combination of tin and silver. In some embodiments the width of the selected zone is between about 0.05-1 mm. In one implementation, the width of the selected zone is about 0.25 mm. In some embodiments the mask is photoresist and the second lipseal is in direct contact with the photoresist during the course of electroplating. The widths of the through-mask recessed features can vary and in some embodiments the through-mask recessed features have widths of between about 1050 µm. In some embodiments the mask has a thickness of between about 10-100 µm.

In some embodiments, the first and second lipseals are made from an elastomeric material, a width of the selected zone is equal to a difference between an inner radius of the second lipseal and an inner radius of the first lipseal, and the selected zone has an annular shape.

In another aspect a method of electrodepositing a metal onto a semiconductor substrate, while preventing or reducing deposition of the metal on a lipseal of an electroplating apparatus, is provided, where the method includes in one embodiment: (a) providing a semiconductor substrate into a substrate holder of the electroplating apparatus, wherein the substrate holder comprises a lipseal, wherein the lipseal is positioned such that at least a portion of the lipseal contacts an electrolyte during electroplating; and (b) electroplating the metal onto the semiconductor substrate, while preventing or reducing ionic current flow directed to the lipseal.

In some embodiments, preventing or reducing the ionic current flow directed to the lipseal includes electroplating the metal such that the lipseal does not come into contact with a cathodically biased conductive material on the semiconductor substrate during the course of electroplating. In some embodiments, electroplating in (b) includes electrodepositing the metal into through-mask recessed features, while the lipseal is in contact with a non-conductive mask material without being in contact with a conductive metal layer that is being electrodeposited onto the semiconductor substrate. In some embodiments tin (Sn) and silver (Ag) are being simultaneously deposited onto the semiconductor substrate (e.g., into the through-mask features). In other embodiments tin is electrodeposited as a single metal.

In another aspect, a method is provided, where the method includes: (a) electrodepositing a first metal into recessed through-mask features of a semiconductor substrate in a first electroplating cell using a first lipseal, such that the metal is not electrodeposited in a selected zone shielded by the first lipseal, wherein the selected zone is located at a periphery of the substrate; and (b) electrodepositing a second metal into the recessed through-mask features after (a) in a second electroplating cell using a second lipseal having a larger diameter than the first lipseal, and positioned adjacent to a selected zone, wherein the electrodeposition in the selected zone does not result in electrodeposition above a plane of the mask and does not result in contact of the electrodeposited second metal with the second lipseal, while electrodeposition elsewhere on the semiconductor substrate results in electrodeposition above the plane of the mask. In some embodiments the first metal is copper and the second metal is a combination of tin and silver. In other embodiments both the first metal and the second metal are the same. For example, in one embodiment the first metal is a combination of tin and silver, and the second metal is a combination of tin and silver as well. In some embodiments the width of the selected zone is between about 0.05-1 mm. For example, in one implementation the width of the selected zone is about 0.25 mm. In some embodiments the through-mask recessed features have widths of between about 10-50 μm. In some embodiments the mask has a thickness of between about 10-100 μm. The mask material may be photoresist and the second lipseal is typically in direct contact with the photoresist during the course of electroplating. In another aspect a method of electrodepositing a metal onto a semiconductor substrate having a plurality of through-mask recessed features, while preventing or reducing deposition of a metal on a lipseal of an electroplating apparatus, is provided. In some embodiments the method includes: (a) electrodepositing a metal into the recessed through-mask features of the semiconductor substrate in an electroplating cell while shielding a selected zone proximate a lipseal such that the metal is not allowed to deposit above the plane of the mask and contact the lipseal. In one implementation, the selected zone is shielded by a shield attached (e.g., releasably attached) to the lipseal, where the distance from the shield to the substrate is less than about 1 mm. In some embodiments the selected zone has a width of less than about 1 mm.

In another aspect, a method is provided, where the method includes: (a) electrodepositing a metal into the recessed through-mask features of the semiconductor substrate in an electroplating cell using a flexible lipseal wherein the flexible lipseal is configured in a first position, such that the metal is not electrodeposited in a selected zone shielded by the first position of the lipseal, wherein the selected zone is located at a periphery of the substrate; and (b) configuring the flexible lipseal to a second position to remove the shielding of the selected zone, and electrodepositing the metal into the recessed through-mask features after (a) while the lipseal is in the second position, wherein the electrodeposition in the selected zone does not result in electrodeposition above the plane of the mask and in a contact with the lipseal, while electrodeposition elsewhere on the semiconductor substrate results in electrodeposition above the plane of the mask. In some embodiments, the flexible lipseal changes from the first configuration to the second configuration using torque, including cup geometry driven torque. In some embodiments, the flexible lipseal changes from the first configuration to the second configuration using compression.

In some embodiments provided methods further include the steps of: applying photoresist to the semiconductor substrate; exposing the photoresist to light; patterning the photoresist and transferring the pattern to the semiconductor substrate; and selectively removing the photoresist from the semiconductor substrate.

In another aspect, a system for electroplating a metal onto the semiconductor substrate is provided, where the system includes: (a) a first electroplating apparatus configured for electrodepositing a first metal onto the semiconductor substrate, the first electroplating apparatus comprising a substrate holder having a first lipseal; and (b) a second electroplating apparatus configured for electrodepositing a second metal onto the semiconductor substrate, the second electroplating apparatus comprising a substrate holder having a second lipseal, wherein the second lipseal has a greater inner diameter than the first lipseal. In some embodiments, the difference between an inner radius of the second lipseal and an inner radius of the first lipseal is less than about 1 mm. In some embodiments a difference between an inner radius of the second lipseal and an inner radius of the first lipseal is between about 0.05-1 mm, such as about 0.25 mm. In some embodiments the first and the second lipseals include elastomeric material. In one embodiment the first and second metals are different, the first electroplating apparatus includes a copper anode, and the second electroplating apparatus includes a tin anode. In another embodiment the first metal and the second metal are both a combination of tin and silver, and the first electroplating apparatus and the second electroplating apparatus both include tin anodes. In some embodiments, the system further includes a mechanism configured for transferring the semiconductor substrate from the first electroplating apparatus to the second electroplating apparatus. In some embodiments at least one of the first and second electroplating apparatuses is configured for electrodeposition of a combination of tin and silver, and includes a membrane separating an anode chamber and a cathode chamber, wherein the membrane substantially prevents silver ions from moving across the membrane. For example, in one implementation, the first electroplating apparatus is configured for electrodeposition of copper, and the second apparatus is configured for electrodeposition of a combination of tin and silver.

In some embodiments, the system further includes a controller having program instructions for causing: (i) electroplating of a first metal in the first electroplating apparatus to partially fill through-mask recessed features; (ii) transfer of the semiconductor substrate to the second electroplating apparatus; and (iii) electroplating of a second metal in the second electroplating apparatus over the first metal, such that the second lipseal does not come into contact with the electrodeposited second metal during the course of deposition, and such that at least some of the recessed through-mask features are filled above a plane of a mask.

In another aspect, an electroplating apparatus for depositing a metal onto a semiconductor substrate is provided, wherein the apparatus includes: (a) a plating vessel configured to hold an electrolyte and an anode; and (b) a substrate holder configured to hold and cathodically bias the semiconductor substrate during electroplating, wherein the substrate holder comprises a lipseal having an attached shield extending inward from the inner surface of the lipseal. In some embodiments, the shield has a width of less than about 1 mm. In some embodiments, the shield is positioned such that a distance from the shield to the semiconductor substrate during electroplating is less than about 1 mm.

In another aspect, an electroplating apparatus for depositing a metal onto a semiconductor substrate is provided, where the apparatus includes: (a) a plating vessel configured to hold an electrolyte and an anode; and (b) a substrate holder configured to hold and cathodically bias the semiconductor substrate during electroplating, wherein the electroplating apparatus further comprises an annular shield having a width of less than about 1 mm positioned proximate a lipseal of the substrate holder.

In another aspect, an electroplating apparatus for depositing a metal onto a semiconductor substrate is provided, where the apparatus includes: (a) a plating vessel configured to hold an electrolyte and an anode; and (b) a substrate holder configured to hold and cathodically bias the semiconductor substrate during electroplating, wherein the substrate holder comprises a flexible lipseal configured to change shape between a first position and a second position, wherein the first and second positions differently shield the surface of the semiconductor substrate. In some embodiments, the flexible lipseal is configured to change shape between the first position and the second position using torque. In some embodiments, the flexible lipseal is configured to change shape between the first position and the second position using compression.

Any of the apparatuses provided herein can include a controller having program instructions configured to cause any of the steps of the methods provided herein.

In another aspect, a non-transitory computer machine-readable media is provided, wherein the non-transitory computer machine-readable media includes a code configured to cause the steps of any of the methods provided herein.

These and other aspects of implementations of the subject matter described in this specification are set forth in the accompanying drawings and the description below.

DETAILED DESCRIPTION OF THE PREFERRED EMBODIMENTS

Figure 1:
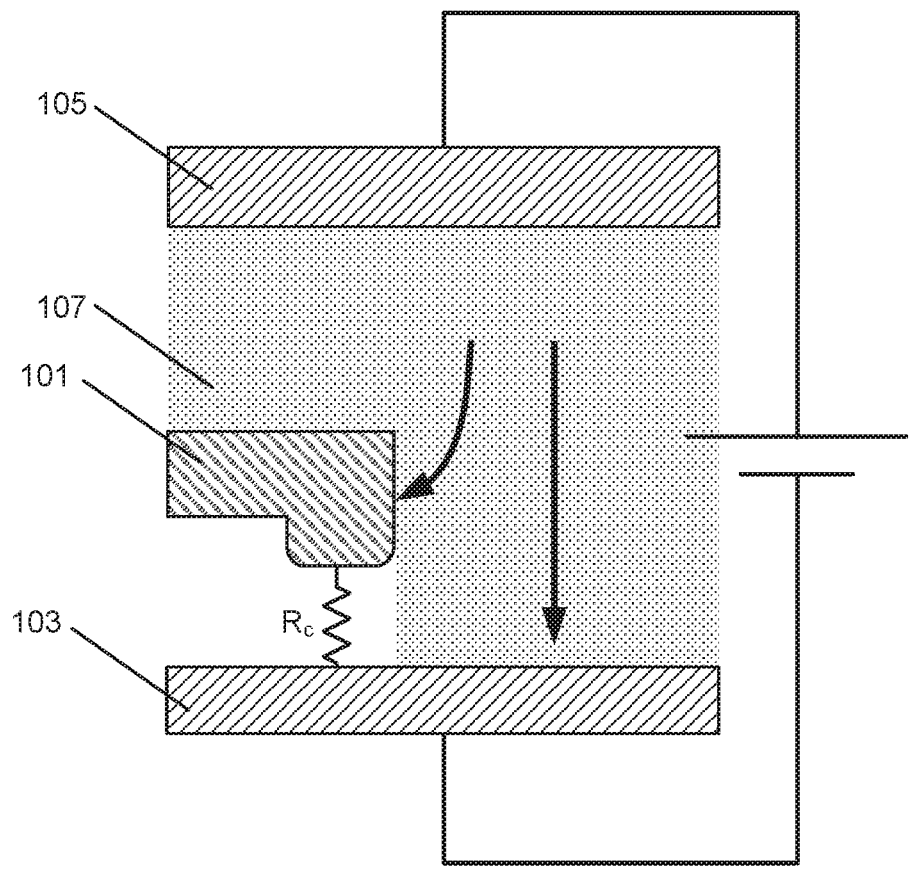
FIG. 1 is a schematic depiction of a portion of an electroplating cell, illustrating ionic current flow to a lipseal.

One of the problems encountered during electrodeposition of SnAg (a combination of tin and silver) metal in through-mask (e.g., through-resist) features is inadvertent formation of metal deposits on a lipseal. The mechanism of formation of these deposits was not previously fully understood.

Methods and apparatuses for preventing or minimizing deposits of metals on a lipseal are herein provided. The provided methods have enhanced lipseal lifetime by more than eight times. The methods and apparatuses are particularly useful for electroplating on semiconductor substrates having through-mask recessed features (e.g., in WLP processing), but are not limited to these applications. The methods can be used for minimizing lipseal deposits during electroplating of a variety of metals, but will be primarily illustrated with reference to simultaneous tin silver (SnAg) electroplating on substrates with through-mask features. The term "a metal" as used in the claims, refers to one or more metals, and "electrodeposition of a metal" is not limited to electrodeposition of a single metal. For example, the metal may be a combination of two metals, where one of the metals is more noble (has a higher electrode potential) than the other metal. For example, "a metal" can be a combination of tin and silver. In some embodiments, the methods are used for electrodeposition of tin (Sn) as a single metal. In other embodiments, the methods are used for electrodeposition of tin (Sn) simultaneously with another metal.

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates. The following detailed description assumes the disclosed implementations are implemented on a semiconductor wafer, such as on a 200 mm, 300 mm, or 450 mm semiconductor wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

The term "about" when used in reference to numerical values includes a range of ±10% of the recited numerical value, unless otherwise specified.

Deposition of metals on an electrolytic processing wafer holding assembly's elastic sealing member, referred to hereafter as a lipseal, is a leading cause of wafer scrap in SnAg electrodeposition processes for wafer level solder bumping. It was discovered that while the mechanism of lipseal plate-out involves both an electroless and electrolytic components, the electrolytic component is the major contributor to the plate-out, and the undesired deposition of metals on the lipseal can be drastically reduced by preventing the lipseal from making contact with a cathodically biased conductive material on the semiconductor substrate. It was determined by calculations that the electrolytic plating is more than 1,000 times faster than electroless plating on a lipseal, and that only several angstroms of metal are typically deposited on the lipseal during plating on one wafer by an electroless mechanism, while the electrolytic plating on the lipseal is capable of the growth of several microns of metal per one wafer processing.

With repeated exposure to SnAg chemistry (tin and silver ions in the electrolyte), lipseals and other hardware develop an atomic coating of metal atoms due to the self-reactive nature of the plating bath components (as opposed to, for example, a process which is driven by external imposed energy, such as electrolytic processes). This self-reactive process is referred to as the electroless component of the mechanism of the lipseal plate-out. Contact between the surface-bound metal atoms on the lipseals with the cathodically biased metal layers on the substrate results in electroplating on the lipseal (referred to as an electrolytic component of the mechanism). The metal on the lipseal (now also under cathodic bias) steals ionic current from the wafer substrate resulting in incomplete solder bump deposition in the patterned features.

It is extremely difficult to prevent the reactions in solution that result in the binding of metal atoms to the lipseal surface (sensitization and activation in the electroless mechanism component). This electroless component is particularly pronounced for tin-containing electrolytes due to aggressive adsorption of tin to elastomeric materials of the lipseals. However, wafer scrap can be avoided by ensuring that this reactive surface (formed after electroless deposition) does not come into contact with the cathodically biased conductive layer on the wafer to propagate electrolytic metal deposition on the lipseal. If there is no contact between the lipseal and the cathodically biased metal on the substrate, this creates an 'open circuit' condition so that the isolated metal atoms on the lipseal surface never become in contact with the circuit that drives electrolytic deposition, which propagates thick metal plating on the metal atom nucleation sites.

The schematic presentation of electrical connectivity in the electroplating system is shown in FIG. 1, which illustrates the lipseal 101 over the cathodically biased conductive layer of the wafer substrate 103, in a vessel containing a positively biased anode 105 and an electrolyte 107, where both the lipseal 101 and the wafer substrate 104 are in contact with the electrolyte 107 containing metal ions. The ionic current in the electrolyte 107 is shown by arrows. The important parameter in this system is the resistance Rc between the lipseal 101 and the conductive layers on the wafer substrate. If Rc is small, such as if there is a direct contact between the lipseal 101 and the cathodically biased material of the substrate 103, the lipseal 101 will act as a secondary cathode and divert ionic current, resulting in large amounts of plating on the lipseal 101. If Rc is large, e.g., if the lipseal 101 rests on a non-conductive mask material without contacting cathodically biased metal layer on the substrate 103, ionic current to the lipseal 101 will be minimized Other methods of reducing ionic current to the lipseal include aggressive shielding.

Accordingly, in one embodiment a method of electrodepositing a metal onto a semiconductor substrate, while preventing or reducing deposition of the metal on a lipseal of an electroplating apparatus, is provided. The method includes: (a) providing a semiconductor substrate (e.g., a wafer having a plurality of recessed through-resist features) into a substrate holder of the electroplating apparatus, wherein the substrate holder includes a lipseal at the peripheral portion of the substrate, wherein the lipseal is positioned such that at least a portion of the lipseal contacts an electrolyte during electroplating; and (b) electroplating the metal onto the semiconductor substrate, while preventing or reducing an ionic current directed to the lipseal.

Figure 2A:
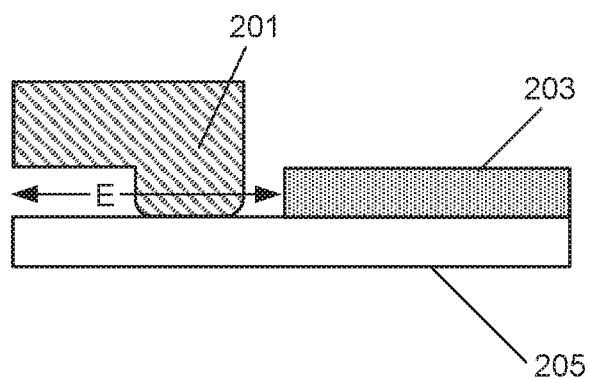
FIG. 2A provides a schematic cross-sectional view of a portion of a semiconductor substrate in a substrate holder illustrating direct contact of a lipseal with a conductive material of the substrate.
Figure 2B:
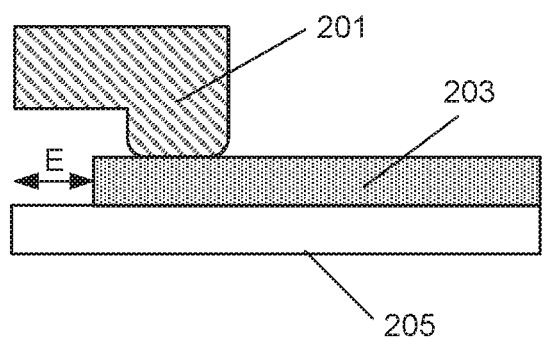
FIG. 2B provides a schematic cross-sectional view of a portion of a semiconductor substrate in a substrate holder illustrating position of a lipseal without a direct contact with a conductive material of the substrate.

The importance of preventing contact between the lipseal and the cathodically biased metal layer on the substrate was experimentally demonstrated. FIG. 2A schematically shows a cross-sectional view of a periphery of the substrate, which illustrates contact between the lipseal 201 and the cathodically biased metal layer 205. The non-conductive material 203 (in some embodiments, photoresist) residing over conductive metal layer 205 is offset from the edge of the wafer. The conductive zone E that is not covered by the non-conductive material 205 is referred to as exclusion zone. FIG. 2B shows another substrate, in which the exclusion zone is smaller and the lipseal instead of making direct contact with the conductive cathodically biased layer 205, resides in direct contact with the non-conductive layer 205. In a specific example, the width of an exclusion zone E (from the edge of the wafer substrate) in the configuration shown in FIG. 2A was 3 mm, while the width of an exclusion zone E in the configuration shown in FIG. 2B was 0.75 mm. In the configuration shown in FIG. 2A lipseal plating was detected after plating on 12 wafers. In the configuration shown in FIG. 2B (without direct contact between the lipseal and the metal layer) lipseal plating was not detected after plating on 384 wafers.

Lipseal contact with the metal layer on the substrate in the photoresist exclusion zone at the edge of the wafer is one of the configurations that should be avoided to prevent lipseal plate-out. However, even if the lipseal diameter is chosen such that the lipseal contacts the non-conductive photoresist layer, without contacting the metal at the very edge of the substrate, plating on a lipseal is still possible, if the lipseal comes into contact with the metal during the course of electroplating. This can occur when the amount of electrodeposited metal is above the plane of the photoresist, also referred to as a "bump-out".

Figure 3A:
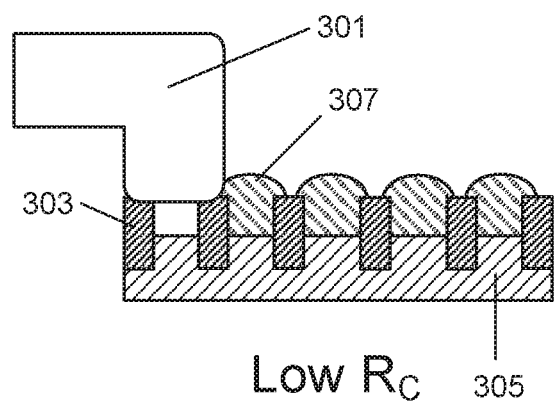
FIG. 3A provides a schematic cross-sectional view of a portion of a semiconductor substrate having through-resist recessed features illustrating a lipseal in contact with bump-out metal.

An example of a mushroom "bump-out" leading to a contact between the deposited metal and the lipseal is illustrated in FIG. 3A. The schematic cross-sectional view of a peripheral portion of the substrate/lipseal assembly is shown. Even though the lipseal 301 initially resides on the photoresist 303 without contacting metal layer 305, during the course of deposition, a metal 307 is deposited such that the features bump out and the electrodeposited metal (which is cathodically biased during deposition) makes contact with the lipseal 301.

In order to prevent contact of the bumped out metal with the lipseal, a selected zone on the wafer substrate adjacent to the lipseal is processed such as to prevent bump-out in this selected zone without preventing bump-out elsewhere on the wafer substrate. For example, the selected zone may be shielded from electrodeposition either during electroplating or in a previous step. Shielding may either reduce or completely block electrodeposition in the selected zone.

Figure 3B:
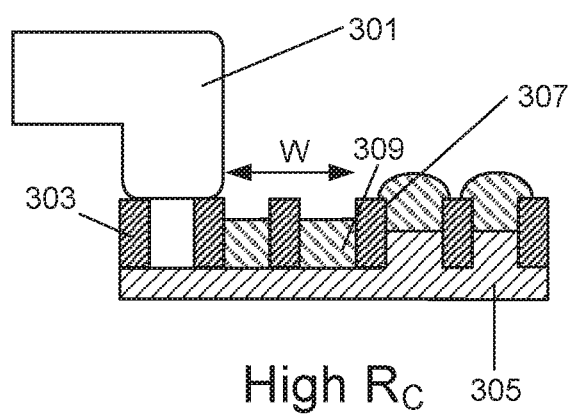
FIG. 3B provides a schematic cross-sectional view of a portion of a semiconductor substrate having through-resist recessed features, illustrating a lipseal in an absence of contact with bump-out metal according to an embodiment provided herein.

A schematic cross-sectional view of a peripheral portion of the substrate after electrodeposition, according to embodiments provided herein, is shown in FIG. 3B. In this embodiment, the lipseal 301 is positioned directly above and in contact with the photoresist 303 without contacting the underlying metal layer 305, but unlike in FIG. 3A (comparative example), in the embodiment of FIG. 3B, the electrodeposited metal 309 in the recessed features adjacent to the lipseal 301 is not allowed to bump out, while the electrodeposited metal 307 elsewhere on the wafer bumps out. The "selected zone" adjacent to the lipseal that is processed (e.g., shielded) to prevent bump out is typically an annular zone having width W. The width W should preferably be small, such as less than about 2 mm, more preferably less than about 1 mm, because the features partially filled in the selected zone are typically not used, and even small widths of the selected zone are effective in preventing of contact between the lipseal and the cathodically biased metal. In some embodiments the width of the selected zone is between about 0.05-1 mm, such as between about 0.1-1 mm, for example about 0.25 mm.

In one embodiment the selected zone is processed to prevent bump-out by shielding the selected zone in a prior electroplating operation. Shielding refers to blocking or reducing ionic current either by dedicated shields or by components of the plating apparatus having other functions (such as by a lipseal). In some embodiments, the selected zone is shielded such that all electrodeposition in the selected zone is blocked in a prior electroplating operation. In some embodiments shielding is used in a single-step deposition (e.g., using a dedicated shield). In other embodiments shielding is used in one or both steps of a two-step deposition.

Figure 4:
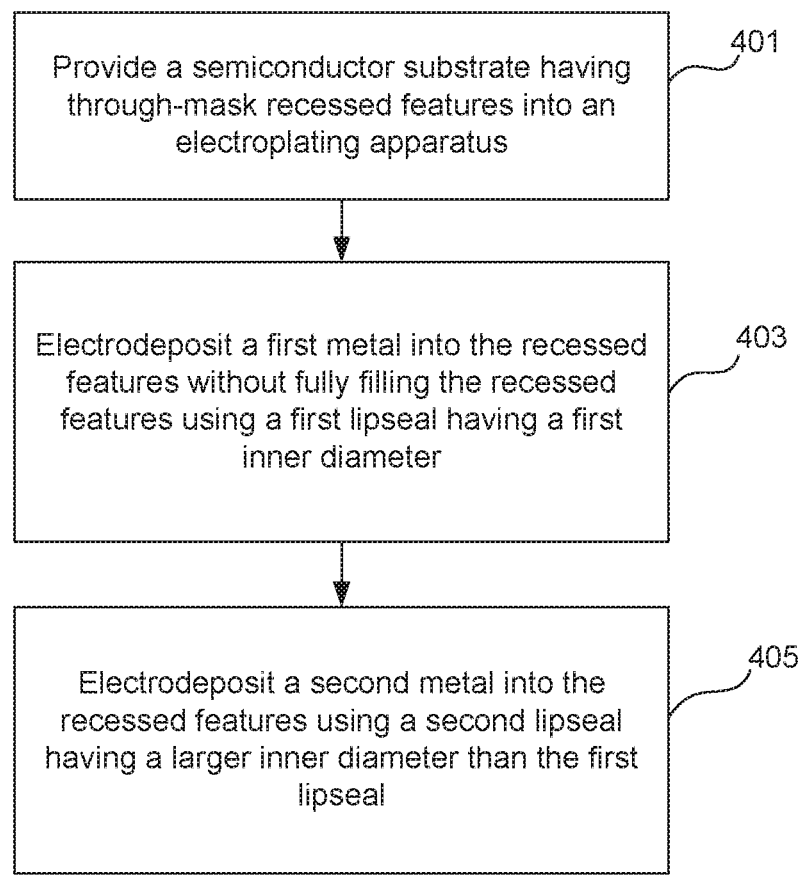
FIG. 4 is a process flow diagram for an electrodeposition method according to an embodiment provided herein.

In one implementation, a method for electrodepositing a metal on a semiconductor substrate is provided where the method involves at least two steps. The first step involves electrodepositing a first metal (e.g., copper) into the recessed through-mask features of the semiconductor substrate in a first electroplating cell using a first lipseal, such that the metal is not electrodeposited in a selected zone shielded by the first lipseal. The subsequent step involves electrodepositing a second metal (e.g., SnAg) into the recessed through-mask features in a second electroplating cell using a second lipseal having a larger inner diameter than the first lipseal, and positioned adjacent to the selected zone, wherein the electrodeposition in the selected zone does not result in electrodeposition above the plane of the mask (bump-out) and in contact with the second lipseal, while electrodeposition elsewhere on the semiconductor substrate results in electrodeposition above the plane of the mask (bump-out). This is illustrated in FIG. 4, which shows a process flow diagram for electrodeposition of metals into through-mask recessed features, while preventing or reducing electrodeposition on the lipseal. In step 401 a semiconductor substrate having through-mask recessed features is provided into an electroplating apparatus. Next, in step 403, a first metal is electrodeposited into the recessed features without fully filling the recessed features using a first lipseal having a first inner diameter. After the first metal has been electrodeposited, in step 405 a second metal is electrodeposited into the recessed features using a second lipseal, where an inner diameter of the second lipseal is greater than the first lipseal. In some embodiments the first and second metals are different metals (e.g., first metal is copper and the second metal is a combination of tin and silver). In other embodiments the first and second metals are identical (e.g., both of the first and second metals are a combination of tin and silver).

Figure 5A:
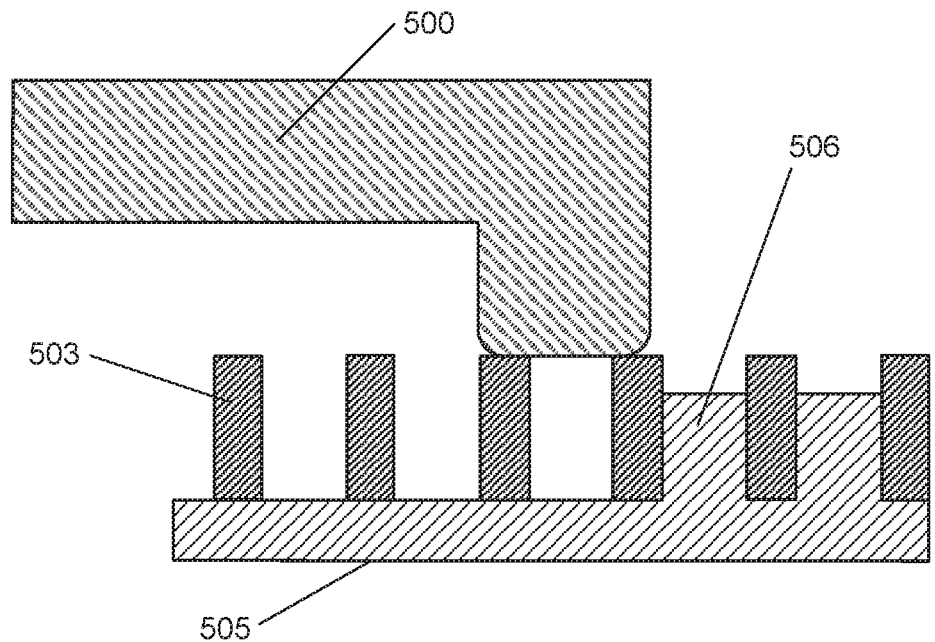
FIGS. 5A-5B provide schematic cross-sectional views of a portion of a semiconductor substrate having through-resist recessed features during the course of electroplating, according to an embodiment provided herein.
Figure 5B:
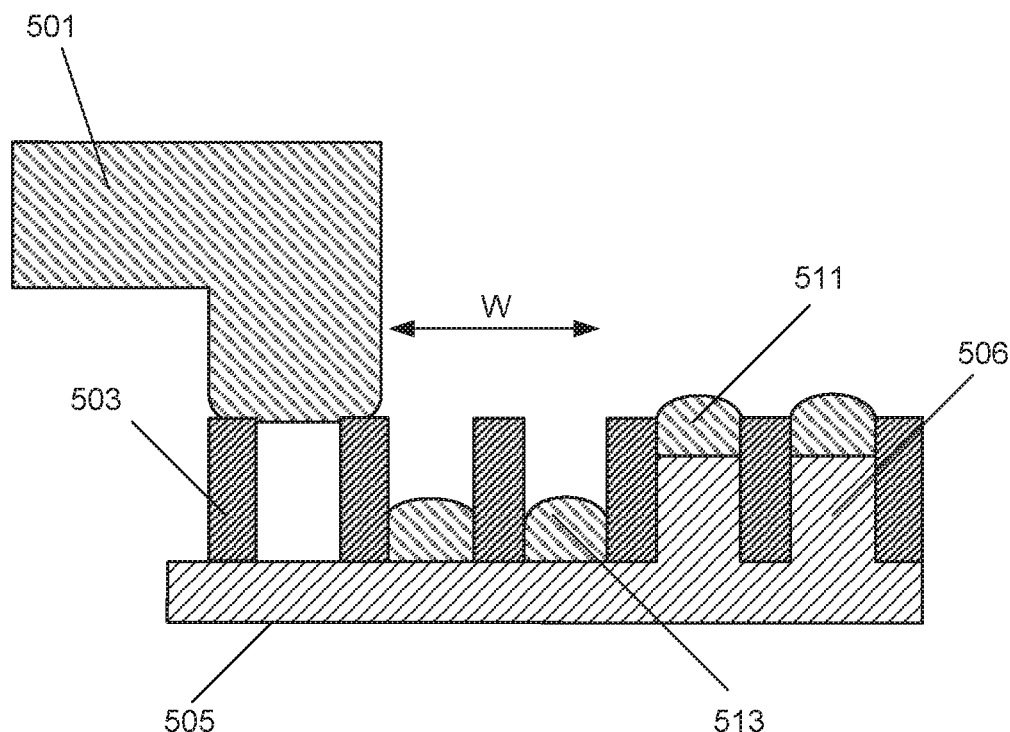

An example of a substrate obtained after the first electrodeposition step is shown in FIG. 5A. In the depicted embodiment in the first step copper is electrodeposited into the recessed through-resist features without fully filling the recessed features in a copper electroplating cell using a lipseal 500. The lipseal 500 resides over photoresist 503 without contacting an underlying copper layer 505 and serves as a shield blocking ionic current to the selected zone. Copper 506 deposited in the recessed features is shown. Next, the wafer substrate is transferred to a new plating cell configured for electroplating SnAg caps over copper in the features. In the new plating cell the lipseal 501 is used which has a larger inner diameter than the lipseal 500. Because of this difference in diameters prior to plating SnAg, the lipseal 501 resides near unfilled recessed features which form the selected zone having width W. The width W of the selected zone is equal to the difference between the inner radius of the second lipseal and the inner radius of the first lipseal. The numerical characteristics of the width of the selected zone have been discussed. Because at the beginning of plating of SnAg the recessed features in the selected zone adjacent to lipseal 501 were unfilled, and other recessed features were partially filled with copper, electroplating can be conducted such that after conclusion of the electroplating the recessed features outside the selected zone have SnAg bumps 511 above the level of photoresist 503, while the recessed features in the selected zone have deposited SnAg 513 that stays well below the level of photoresist and does not risk coming into contact with the lipseal 301. The substrate obtained after the electrodeposition is shown in FIG. 3B.

This method can be used for depositing copper pillars with SnAg caps. In the case of multilayer stacks (e.g. copper pillars), the lipseals of varying diameter are chosen such that bumps immediately next to the lipseal never bump-out. This is achieved by selecting a smaller diameter lipseal for the Cu layer and a larger diameter lipseal for the SnAg layer. For example, copper pillar may consist of 20 µm Cu with a 20 µm SnAg cap. In this case, if the photoresist is on the order of 40 µm or less, the SnAg cap may plate beyond the photoresist to come in contact with the lipseal. However, if the lipseal used in copper plating has a slightly smaller diameter than the lipseal used in SnAg plating (e.g. 0.05-1 mm radius difference between the lipseals), then copper will not plate directly next to the lipseal. Therefore, the total thickness near the lipseal will only be 20 µm SnAg and the metal will remain deep in the photoresist so the lipseal will never come in contact with the cathode. In this case, there is no copper plated immediately next to the lipseal used in tin silver plating, so the SnAg layer does not bump out.

In some embodiments additional electrodeposition steps may be added to the sequence. In one implementation a thin layer of nickel is electroplated between the copper deposition step and SnAg deposition step in a third plating cell configured for nickel deposition.

It is noted that while in the depicted example the metal deposited in the first step is copper and the metal deposited in the second step is SnAg, the first and second metals do not necessarily have to be different. For example in some embodiments both the first metal and the second metal are SnAg. The first portion of SnAg is deposited (without fully filling the features) using a lipseal that blocks the selected zone, and then the substrate is transferred to another cell having a lipseal of a larger diameter opening up the selected zone with unfilled features. Then the remainder of SnAg is deposited allowing the features outside the selected zone to bump out. In the case of single-layer SnAg deposition (e.g. C4 bumps), the bump out typically occurs in a single step. This method could be applied to C4 bumps but the SnAg plating would be split into two steps on two different plating apparatuses. For example, the first step would plate 50% of the SnAg layer thickness using a smaller diameter lipseal, then the second step would plate the remaining SnAg with a wider diameter lipseal.

In another aspect, a system for electroplating a metal onto the semiconductor substrate is provided, where the system includes: (a) a first electroplating apparatus configured for electrodepositing a first metal onto the semiconductor substrate, the first electroplating apparatus having a substrate holder having a first lipseal; and (b) a second electroplating apparatus configured for electrodepositing a second metal onto the semiconductor substrate, the second electroplating apparatus having a substrate holder having a second lipseal, wherein the second lipseal has a greater diameter than the first lipseal. In some embodiments the difference between the inner radius of the second lipseal and the inner radius of the first lipseal is less than about 1 mm. The apparatus may further include a robotic transfer mechanism for transferring the substrate from the first electroplating apparatus to the second electroplating apparatus and a controller including program instructions for performing the methods described herein.

Figure 6:
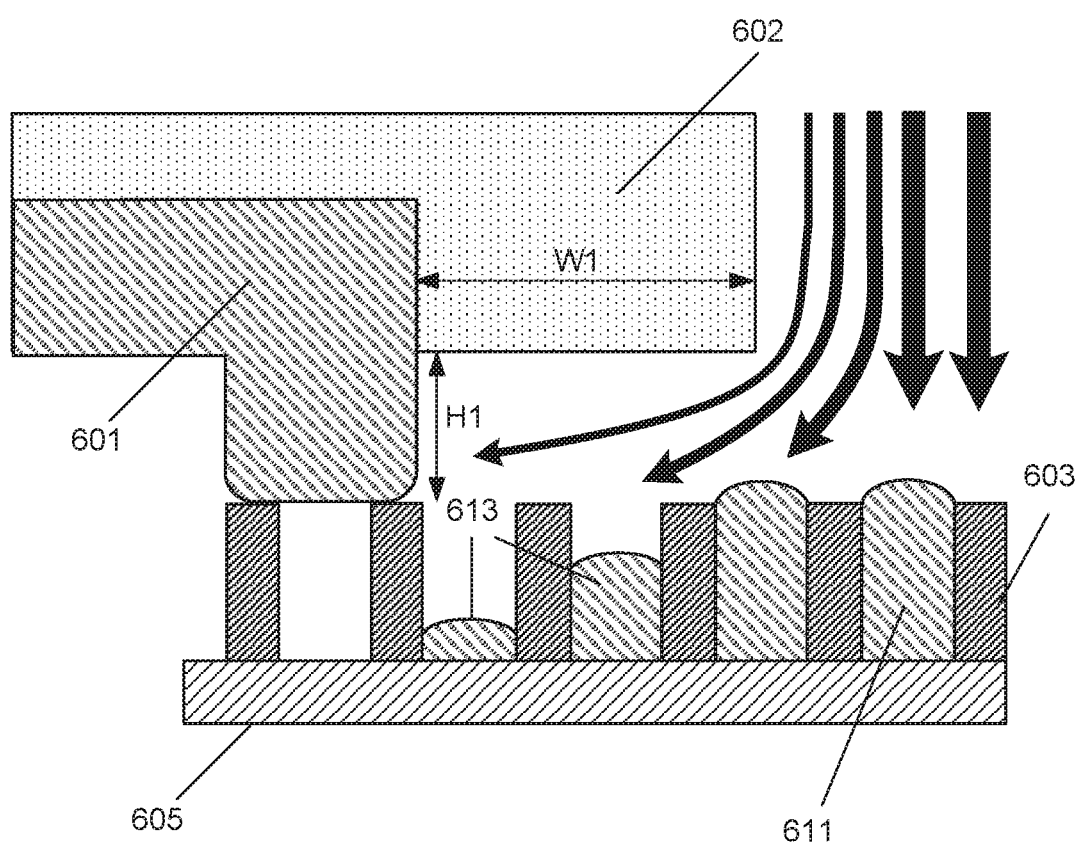
FIG. 6 provides a schematic cross-sectional view of a portion of a semiconductor substrate having through-resist recessed features, undergoing electroplating using a lipseal having an attached shield, according to an embodiment provided herein.

In some embodiments the processing of the selected zone to prevent bump out is performed concurrently with electroplating by shielding the selected zone using a shield. In some embodiments a method of electrodepositing a metal (e.g., SnAg) onto a semiconductor substrate having a plurality of through-mask recessed features, while preventing or reducing deposition of a metal on a lipseal of an electroplating apparatus, is provided where the method includes: electrodepositing the metal into the recessed through-mask features of the semiconductor substrate in an electroplating cell while shielding a selected zone proximate a lipseal such that the metal is not allowed to deposit above the plane of the mask and contact the lipseal. In some embodiments the selected zone is shielded by a shield releasably attached to the lipseal. This configuration is shown in FIG. 6, which illustrates a schematic cross-sectional view of a peripheral portion of a substrate having filled through-resist recessed features using a lipseal 601 with attached shield 602. The shield is not in contact with the photoresist 603 (the gap between the shield and the substrate is filled with electrolyte) but is still effective in reducing the ionic current (and consequently plated thickness) in the selected zone. The ionic current is illustrated by arrows, which are directed at a cathodically biased metal layer 605. It is illustrated that the recessed features outside the selected zone are allowed to bump-out as shown by SnAg fill 611, whereas the recessed features in the selected zone are sufficiently shielded for SnAg deposits 613 to remain well within the features. The shield can have a relatively small width W1 of less than about 2 mm (e.g., about 0.05-1 mm) or less than about 1 mm. In some embodiments the shield is located proximate the substrate (e.g., within about 1 mm from the substrate, referring to distance H1). The shield is in some embodiments made of a non-elastomeric non-conductive material that is compatible with an electrolyte chemistry. The shield (the portion protruding inward from the lipseal) in some embodiments has a generally annular shape. More generally, any suitable shielding approach would reduce ionic current on a very short scale near the lipseal and in most cases the shield would not contact the photoresist to ensure that the shield itself does not risk contact to the cathode and subsequent plate out. The most effective shield would be an extension of the lipseal for the most abrupt local cooling (ionic current reduction), as described above, but generally the shield may be positioned anywhere between the substrate and the anode.

In another embodiment the selected zone can be processed to prevent bump-out by using a flexible lipseal that is configured to change its form from a first configuration to a second configuration, such that in different configurations the selected zone is differently shielded. The advantage of using such modifiable lipseal is that electrodeposition in the selected zone can be blocked and then the selected zone can be opened to plating without changing the plating cell.

In one implementation the electrodeposition method involves: (a) electrodepositing a metal into the recessed through-mask features of the semiconductor substrate in an electroplating cell using a flexible lipseal, wherein the flexible lipseal is configured in a first position, such that the metal is not electrodeposited in a selected zone shielded by the first position of the lipseal, wherein the selected zone is located at a periphery of the substrate; and (b) configuring the flexible lipseal to a second position to remove the shielding of the selected zone, and electrodepositing the metal into the recessed through-mask features after (a) while the lipseal is in the second position, wherein the electrodeposition in the selected zone does not result in electrodeposition above the plane of the mask and in a contact with the lipseal, while electrodeposition elsewhere on the semiconductor substrate results in electrodeposition above the plane of the mask.

Figure 7A:
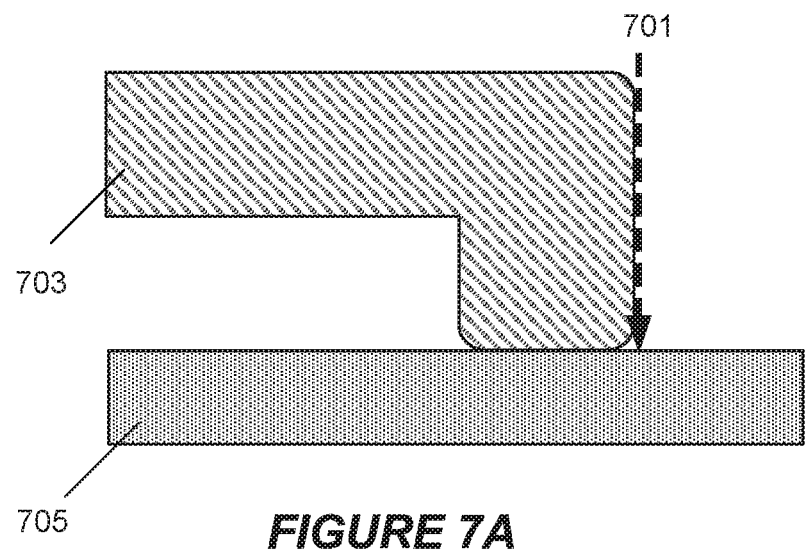
FIGS. 7A-7C show schematic cross-sectional views of a portion of a modifiable lipseal that can be used in electrodeposition according to embodiments provided herein.
Figure 7B:
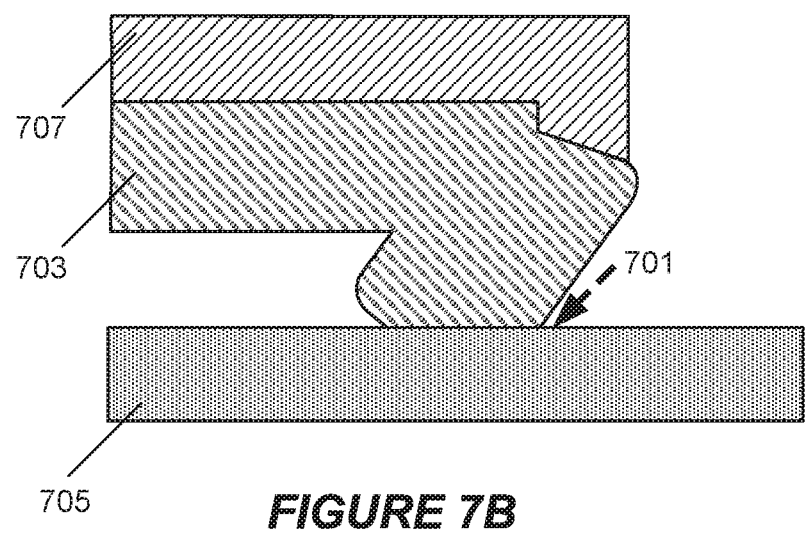
Figure 7C:
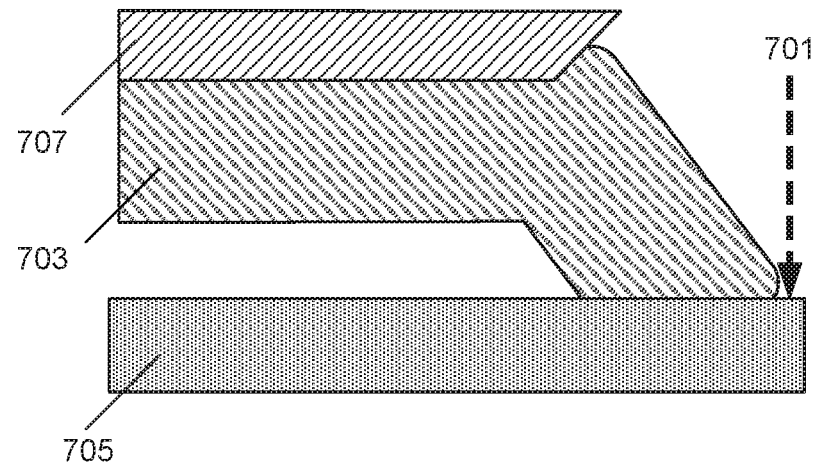

In some embodiments the lipseal is changed from a first configuration to a second configuration using torque. In some embodiments the torque is induced by a geometry of a cup holding the substrate. An example of such a lipseal are illustrated in FIGS. 7A-7C, which illustrate the location of lipseal-wafer contact 701 can be changed by using a torque on a cup 707 holding the substrate between configuration of FIG. 7A, configuration of FIG. 7B, and configuration of FIG. 7C. For example, tin silver plating can be started when the lipseal 703 is in position shown in FIG. 7A, where the point of contact 701 with the substrate 705 is further inward. Next, before features bump out, the configuration of the lipseal 703 can be changed to a configuration shown in position 7B, such that a selected region previously blocked by configuration shown in FIG. 7A is opened up to plating. Then plating can proceed such that the features in the selected region are not allowed to bump out, whereas features outside the selected region bump out. Alternatively, the plating may be started in configuration shown in FIG. 7C, and then completed in configuration shown in FIG. 7A or FIG. 7B. Different steps may have variations in lipseal supporting hardware that drive different exclusion (shielding) via torqueing the identical lipseals in different ways.

Figure 8A:
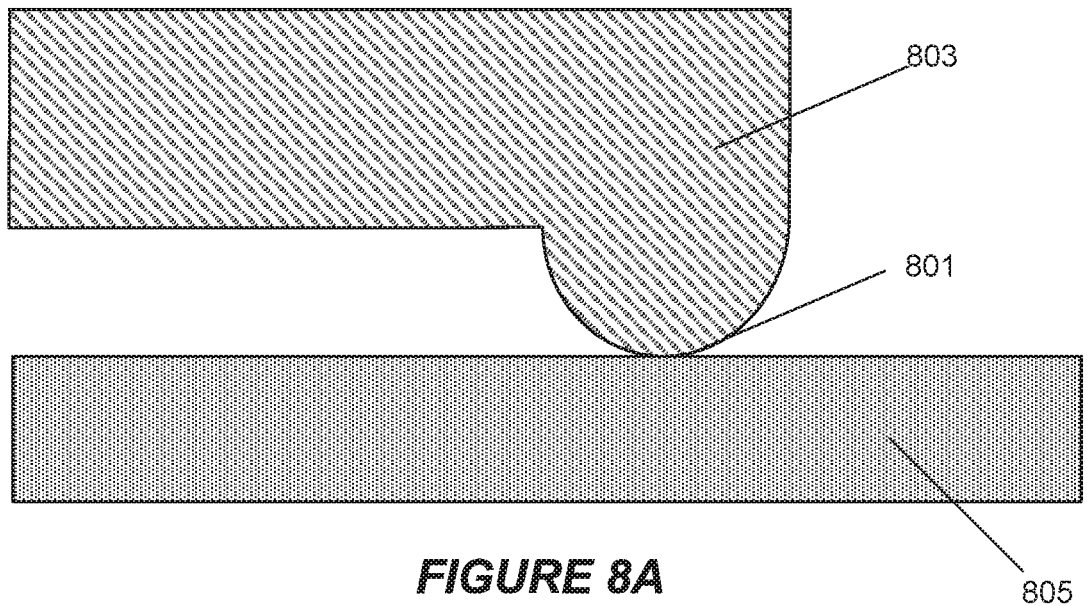
FIGS. 8A-8B show schematic cross-sectional views of a different modifiable lipseal that can be used in electrodeposition according to embodiments provided herein.
Figure 8B:
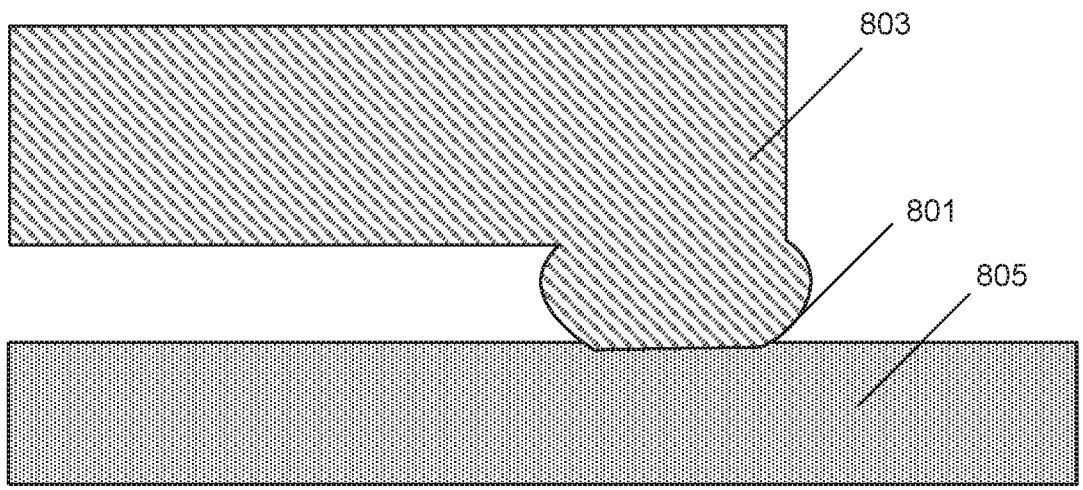

In some embodiments the lipseal is changed from a first configuration to a second configuration using compression. An example of such a lipseal is illustrated in FIGS. 8A-8B, where the size of lipseal-wafer contact can be changed by using cup compression force or contacts spring compression force. FIG. 8A illustrates a portion of a lipseal and a substrate, where the lipseal is in an uncompressed state, whereas FIG. 8B illustrates the same portion of the lipseal and the substrate, where the lipseal is in a compressed state. In some embodiments, tin silver plating can be started when the lipseal is in position shown in FIG. 8B (compressed state), and before features bump out. In the compressed configuration, the innermost point of contact 801 between the lipseal 803 and the substrate 805 is closer to the center of the substrate than in an uncompressed state shown in FIG. 8A. After initial plating using the compressed lipseal shown in FIG. 8B, The configuration of the lipseal can be changed to a configuration shown in FIG. 8A (uncompressed), such that a selected region previously blocked by configuration shown in FIG. 8B is opened up to plating. Then plating can proceed such that the features in the selected region are not allowed to bump out, whereas features outside the selected region bump out.

The methods and apparatuses provided herein can reduce lipseal plate-out and can be used either alone or in combination with other methods that can reduce the effects of plate-out. In some embodiments the lipseal is made of an elastomeric non-conductive material, which in some implementations may be hydrophobic or coated with a hydrophobic coating (e.g., a perfluorinated polymer). The use of hydrophobic surfaces for the materials of a lipseal can reduce the initial adsorption and electroless deposition of metals on the lipseal. Further in some embodiments, lipseals can be used without periodic cleaning, while in other embodiments cleaning of the lipseals can be performed periodically (e.g., after processing of a defined number of wafers).

Apparatus

The deposition methods described herein can be carried out in a variety of electroplating apparatuses. A suitable apparatus includes a plating chamber configured for holding an electrolyte and an anode, and a substrate holder having contacts for cathodically biasing the substrate, a cup for holding the substrate and a lipseal. Deposition can be conducted in a face-up or a face-down orientation. Some plating tools may be also run vertically. An example of a suitable apparatus is a SABRE 3D tool available from Lam Research Corp. of Fremont, CA. In some embodiments the electroplating tool includes multiple plating cells (for electrodepositing identical or different metals) and a robotic tool for transferring the substrate between the individual plating cells.

In some embodiments, electroplating of a first metal (e.g., copper) is conducted in a first electroplating apparatus having a first plating chamber and a first substrate holder with a first lipseal, and electroplating of a second metal is conducted in a second electroplating apparatus having a second plating chamber, and a second substrate holder with a second lipseal (e.g., a lipseal of a larger inner diameter than the first lipseal).

Figure 9:
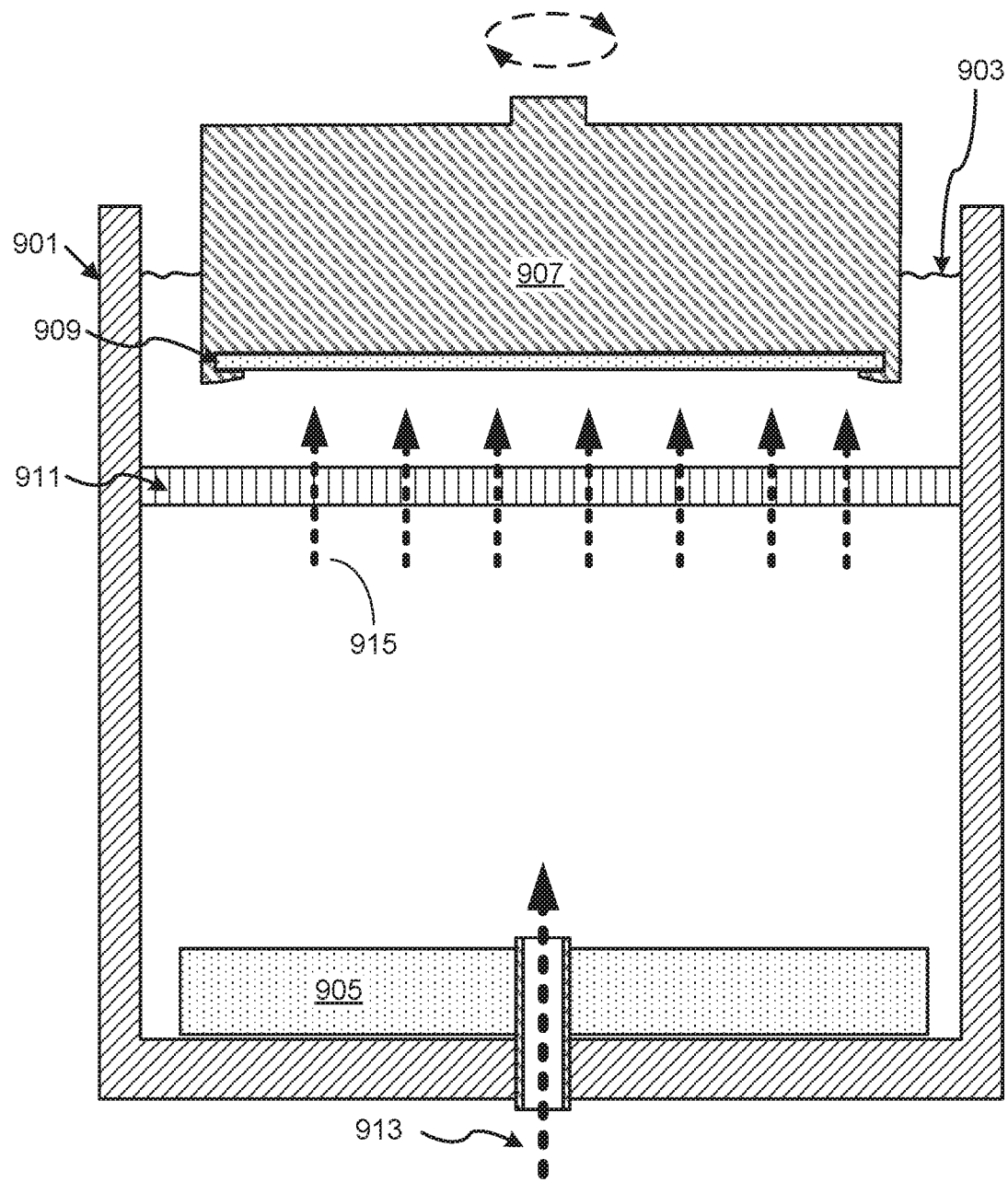
FIG. 9 is a simplified schematic cross-sectional view of an electroplating cell that can be used in electroplating according to embodiments provided herein.

A schematic cross-sectional view of an apparatus that can be used for electrodeposition of a first or second metal in a face-down orientation is shown in FIG. 9. The apparatus includes a plating chamber 901 configured to hold electrolyte 903, and an anode 905. The substrate holder 907 is configured to hold the semiconductor substrate 909 in a face-down orientation and to rotate the substrate 909 during electroplating. The substrate holder 907 further includes electrical contacts that are configured to cathodically (negatively) bias the substrate during electroplating. In the illustrated embodiment the apparatus further includes an ionically resistive ionically permeable element 911 proximate the substrate 909 (e.g., within about 10 mm of the substrate). The ionically resistive ionically permeable element 911 is typically a plate made of a non-conductive material that has a plurality of through-channels or a 3D porous network that allows for flow of electrolyte. The ionically resistive ionically permeable element 911 is often used to improve the uniformity of plating on the semiconductor substrate 909.

The plating chamber 901 includes an opening 913 for introduction of electrolyte. In the depicted embodiment, the electrolyte is admitted at the bottom portion of the plating chamber and then flows as depicted by arrows 915 through the channels of the ionically resistive ionically permeable element 911 towards the semiconductor substrate 909. In other embodiments the electrolyte can be injected laterally in a direction that is substantially parallel to the working surface of the semiconductor substrate 909 in addition to, or instead of the flow of electrolyte that is substantially perpendicular to the working surface of the semiconductor substrate 909.

In some embodiments the apparatus further includes an ionically permeable membrane between the anode and a cathodically biased substrate, which separates the plating chamber into an anolyte chamber and a catholyte chamber, where electrolyte in the anolyte chamber and catholyte chamber may have different compositions. For example, during electrodeposition of tin silver, the catholyte includes both tin and silver ions, while the anolyte may include only tin ions.

In some embodiments the apparatus further includes a controller having program instructions for causing performance any of the method steps described herein.

Figure 10:
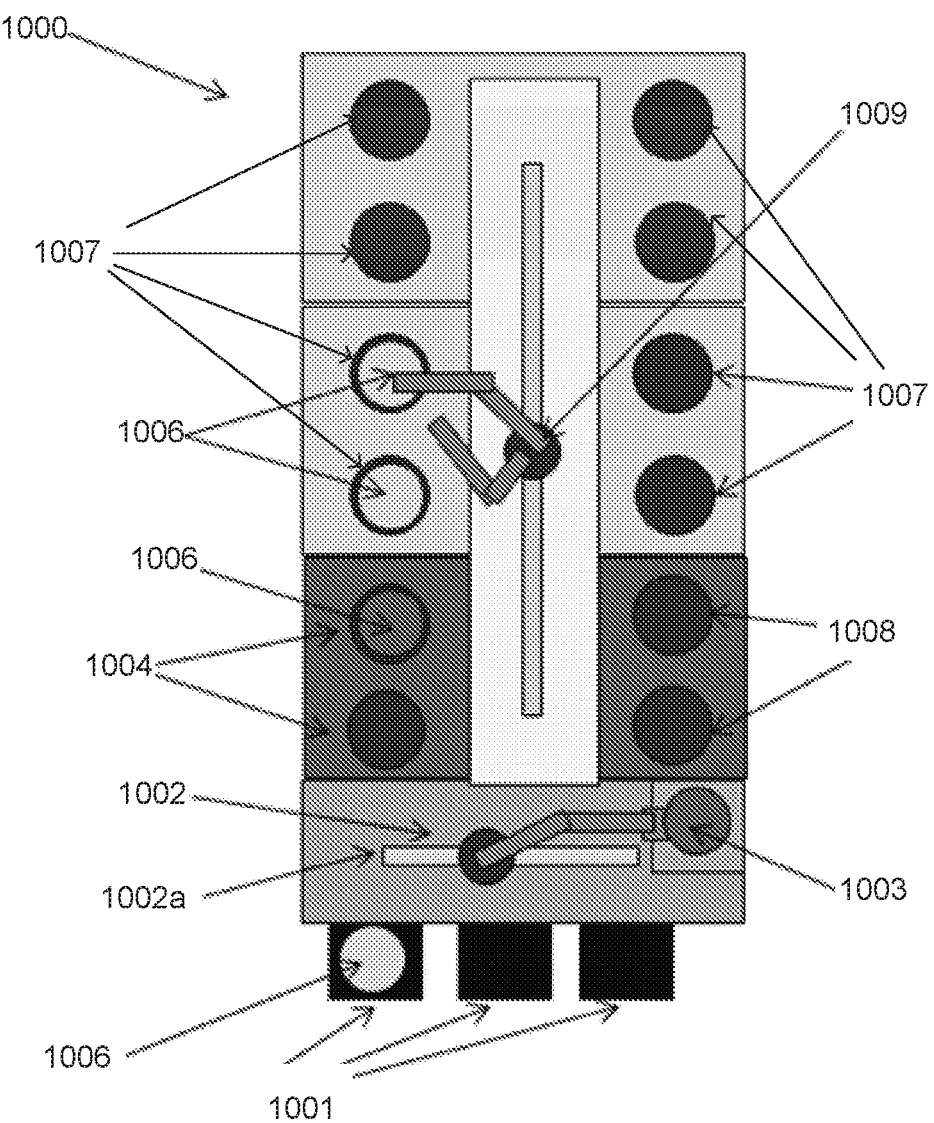
FIG. 10 is a schematic top view of a tool that can be used for electroplating according to embodiments provided herein.

An integrated apparatus configured for electrodeposition of multiple metals is illustrated in FIG. 10. In this embodiment, the apparatus 1000 has a set of electroplating cells 1007, each containing an electrolyte-containing bath, in a paired or multiple "duet" configuration. In addition to electroplating per se, the apparatus 1000 may perform a variety of other electroplating or electroplanarization related processes and sub-steps, such as spin-rinsing, spin-drying, metal and silicon wet etching, electroless deposition, pre-wetting and pre-chemical treating, reducing, annealing, photoresist stripping, and surface pre-activation, for example. The apparatus 1000 is shown schematically looking top down in FIG. 10, and only a single level or "floor" is revealed in the figure, but it is to be readily understood by one having ordinary skill in the art that such an apparatus, e.g. the Lam Research Sabre™ 3D tool, can have two or more levels "stacked" on top of each other, each potentially having identical or different types of processing stations. In some embodiments electroplating stations for different metals are arranged on different levels of the tool. In other embodiments a single level may include stations for electroplating both a first and a second metal.

Referring once again to FIG. 10, the substrates 1006 that are to be electroplated are generally fed to the apparatus 1000 through a front end loading FOUP (front loading unified pod) 1001 and, in this example, are brought from the FOUP to the main substrate processing area of the apparatus 1000 via a front-end robot 1002 that can retract and move a substrate 1006 driven by a spindle 1003 in multiple dimensions from one station to another of the accessible stations—two front-end accessible stations 1004 and also two front-end accessible stations 1008 are shown in this example. The front-end accessible stations 1004 and 1008 may include, for example, pre-treatment stations, and spin rinse drying (SRD) stations. Lateral movement from side-to-side of the front-end robot 1002 is accomplished utilizing robot track 1002a. Each of the substrates 1006 may be held by a cup/cone assembly (not shown) driven by a spindle connected to a motor (not shown), and the motor may be attached to a mounting bracket 1009. Also shown in this example are the four "duets" of electroplating cells 1007, for a total of eight cells 1007. The electroplating cells 1007 may be used for electroplating the first and second metals. After a first metal has been electroplated in one of the plating stations 1007, the substrate is transferred to a plating cell configured for electroplating of a second metal either on the same level of the apparatus or on a different level of the apparatus 1000. A system controller (not shown) may be coupled to the electrodeposition apparatus 1000 to control some or all of the properties of the electrodeposition apparatus 1000. The system controller may be programmed or otherwise configured to execute instructions according to processes described earlier herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of electrolytes, temperature settings (e.g., heating and/or cooling), voltage delivered to the cathode, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In some embodiments the apparatus includes a controller having program instructions for causing performance any of the method steps described herein.

In one aspect, a system for electroplating a metal onto the semiconductor substrate is provided, where the system includes: (a) a first electroplating apparatus configured for electrodepositing a first metal onto the semiconductor substrate, the first electroplating apparatus comprising a substrate holder having a first lipseal; and (b) a second electroplating apparatus configured for electrodepositing a second metal onto the semiconductor substrate, the second electroplating apparatus comprising a substrate holder having a second lipseal, wherein the second lipseal has a greater diameter than the first lipseal. In some embodiments, the difference between an inner radius of the second lipseal and an inner radius of the first lipseal is less than about 1 mm. In some embodiments, the system further includes a controller having program instructions for causing: (i) electroplating of a first metal in the first electroplating apparatus to partially fill through-mask recessed features; (ii) transfer of the semiconductor substrate to the second electroplating apparatus; and (iii) electroplating of a second metal in the second electroplating apparatus over the first metal, such that the second lipseal does not come into contact with the electrodeposited second metal during the course of deposition, and such that at least some of the recessed through-mask features are filled above a plane of a mask.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or EUV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

What is claimed is:

1. A method of electrodepositing a metal onto a semiconductor substrate having a plurality of through-mask recessed features, while preventing or reducing deposition of the metal on a lipseal of an electroplating apparatus, the method comprising:
   (a) electrodepositing a first metal into the through-mask recessed features of the semiconductor substrate in a first electroplating cell using a first lipseal; and
   (b) electrodepositing a second metal into the through-mask recessed features after (a), in a second electroplating cell using a second lipseal having a larger inner diameter than the first lipseal, wherein the semiconductor substrate comprises a selected zone shielded from exposure to an electrolyte by the first lipseal but not by the second lipseal, such that the first metal is not electrodeposited in the selected zone and such that the second metal is allowed to be electrodeposited in the selected zone.

2. The method of claim 1, wherein electrodeposition of the second metal in the selected zone in (b) does not result in electrodeposition above a plane of the mask.

3. The method of claim 1, wherein electrodeposition of the second metal in the selected zone in (b) does not result in contact of the electrodeposited second metal with the second lipseal.

4. The method of claim 1, wherein (b) results in electrodeposition of the second metal above a plane of the mask outside of the selected zone.

5. The method of claim 1, wherein (b) results in electrodeposition of the second metal above a plane of the mask outside of the selected zone, and in electrodeposition below the plane of the mask in the selected zone.

6. The method of claim 1, wherein the first metal is copper and the second metal is a combination of tin and silver.

7. The method of claim 1, wherein the first metal is a combination of tin and silver, and the second metal is a combination of tin and silver.

8. The method of claim 1, wherein the width of the selected zone is between about 0.05-1 mm.

9. The method of claim 1, wherein the width of the selected zone is about 0.25 mm.

10. The method of claim 1, wherein the mask is photoresist and the second lipseal is in direct contact with the photoresist during the course of electroplating.

11. The method of claim 1, wherein the through-mask recessed features have widths of between about 10-50 µm.

12. The method of claim 1, wherein the mask has a thickness of between about 10-100 µm.

13. The method of claim 1, wherein the first and second lipseals are made from an elastomeric material, wherein a width of the selected zone is equal to a difference between an inner radius of the second lipseal and an inner radius of the first lipseal, and wherein the selected zone has an annular shape.

14. A system for electroplating a metal onto the semiconductor substrate, the system comprising:
   (a) a first electroplating apparatus configured for electrodepositing a first metal onto the semiconductor substrate, the first electroplating apparatus comprising a substrate holder having a first lipseal; and
   (b) a second electroplating apparatus configured for electrodepositing a second metal onto the semiconductor substrate, the second electroplating apparatus comprising a substrate holder having a second lipseal, wherein the second lipseal has a greater inner diameter than the first lipseal.

15. The system of claim 14, wherein a difference between an inner radius of the second lipseal and an inner radius of the first lipseal is less than about 1 mm.

16. The system of claim 14, wherein a difference between an inner radius of the second lipseal and an inner radius of the first lipseal is between about 0.05-1 mm.

17. The system of claim 14, wherein a difference between an inner radius of the second lipseal and an inner radius of the first lipseal is about 0.25 mm.

18. The system of claim 14, wherein the first and the second lipseals comprise elastomeric material.

19. The system of claim 14, wherein the first and second metals are different, and wherein the first electroplating apparatus comprises a copper anode, and the second electroplating apparatus comprises a tin anode.

20. The system of claim 14, wherein the first metal and the second metal are both a combination of tin and silver, and wherein the first electroplating apparatus and the second electroplating apparatus both comprise tin anodes.

21. The system of claim 14, further comprising a mechanism configured for transferring the semiconductor substrate from the first electroplating apparatus to the second electroplating apparatus.

22. The system of claim 14, wherein at least one of the first and second electroplating apparatuses is configured for electrodeposition of a combination of tin and silver, and includes a membrane separating an anode chamber and a cathode chamber, wherein the membrane substantially prevents silver ions from moving across the membrane.

23. The system of claim 22, wherein the first electroplating apparatus is configured for electrodeposition of copper, and the second apparatus is configured for electrodeposition of a combination of tin and silver.

24. The system of claim 14, further comprising a controller comprising program instructions for causing:
   (i) electroplating of a first metal in the first electroplating apparatus to partially fill through-mask recessed features on the semiconductor substrate;
   (ii) transfer of the semiconductor substrate to the second electroplating apparatus; and
   (iii) electroplating of a second metal in the second electroplating apparatus over the first metal, such that the second lipseal does not come into contact with the electroplated second metal during the course of electroplating, and such that at least some of the through-mask recessed features are filled above a plane of the mask.

25. A method of electrodepositing a metal onto a semiconductor substrate having a plurality of through-mask recessed features, while preventing or reducing deposition of a metal on a lipseal of an electroplating apparatus, the method comprising:
(a) electrodepositing a metal into the recessed through-mask features of the semiconductor substrate in an electroplating cell using a flexible lipseal wherein the flexible lipseal is configured in a first position, such that the metal is not electrodeposited in a selected zone shielded by the first position of the lipseal, wherein the selected zone is located at a periphery of the substrate; and
(b) configuring the flexible lipseal to a second position to remove the shielding of the selected zone, and electrodepositing the metal into the recessed through-mask features after (a), while the lipseal is in the second position, wherein the electrodeposition in the selected zone does not result in electrodeposition above the plane of the mask and does not result in a contact of the electrodeposited metal with the lipseal, while electrodeposition elsewhere on the semiconductor substrate results in electrodeposition above the plane of the mask.

* * * * *